(12) United States Patent
Wang

(10) Patent No.: US 6,274,444 B1
(45) Date of Patent: Aug. 14, 2001

(54) METHOD FOR FORMING MOSFET

(75) Inventor: Chuan-Fu Wang, Taipei Hsien (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/372,430

(22) Filed: Aug. 10, 1999

(51) Int. Cl.$^7$ ............................................. H01L 21/336
(52) U.S. Cl. ........................... 438/299; 438/300; 438/301
(58) Field of Search ................................. 438/221, 222, 438/296, 299, 300, 301

(56) References Cited

U.S. PATENT DOCUMENTS 5,959,331 * 9/1999 Hsu et al. ............................ 257/349
6,010,928 * 1/2000 Hsu et al. ............................ 438/221

* cited by examiner

Primary Examiner—David Nelms
Assistant Examiner—Dung A Le
(74) Attorney, Agent, or Firm—Thomas, Kayden, Horstemeyer & Risley, LLP

(57) ABSTRACT

A method for forming a MOSFET is described. The feature of this invention is that an epitaxial silicon layer with device isolation structures is formed over a substrate, wherein each device isolation structure is made of oxide. The invention need not etch the substrate for forming a device isolation structure. As a result, the invention not only prevents stress and dislocation generation and avoids leakage current, but also provides an easily method for forming a device isolation structure.

14 Claims, 2 Drawing Sheets

METHOD FOR FORMING MOSFET

BACKGROUND OF THE INVENTION

1. Field of the Invention

The present invention relates to a method for forming a semiconductor device. More particularly, the present invention relates to a method for forming a MOS field effect transistor (MOSFET).

2. Description of the Related Art

An integrated circuit (IC) is composed of many devices and isolation structures that isolate the devices. The isolation structures, such as STI structure or field oxide isolation structure, are used to prevent carriers from moving between devices. Conventionally, the isolation structures are formed within a concentrated semiconductor circuit, for example, between adjacent field effect transistors (FET) in a dynamic random access memory (DRAM), to reduce a leakage current produced by the FET.

An isolation region is formed in an integrated circuit for preventing a short circuit from occurring between adjacent device regions on a substrate. Conventionally, a local oxidation of silicon (LOCOS) technique is widely utilized in the semiconductor industry to provide isolation regions on semiconductor device. However, since internal stress is generated and bird's beak encroachment occurs in the isolation structures, LOCOS cannot effectively isolate devices.

The shallow trench isolation (STI) technique has been developed to improve the bird's beak encroachment of the LOCOS so as to achieve an effective isolation structure. Typically, the STI process comprises the steps of using a mask to define and pattern a shallow trench in a substrate by an anisotropic etching process, and then filling the shallow trench with oxide for use as a device isolation structure. Since the shallow trench isolation structure has a good isolation effect and its size is scaleable, it is often employed as a device isolation structure. The shallow trench isolation is the preferred isolation technique, especially for the fabrication of a metal oxide semiconductor transistor.

Conventionally, the sidewalls of the shallow trench isolation structure are usually perpendicular to the substrate surface; that is, the corner of the shallow trench isolation structure is a right angle. As a result, high stress occurs at the corner of the shallow trench isolation structure. The stress leads to damage of the silicon lattices in the substrate surface; thus dislocation is generated. In a subsequent step, a gate oxide layer formed on the substrate is not able to form a predetermined thickness because the silicon lattices of the substrate surface are damaged. Therefore, a leakage current occurs at the corner of the shallow trench isolation structure.

SUMMARY OF THE INVENTION

Accordingly, the present invention provides a method for forming a MOSFET to avoid leakage current while forming a device isolation structure in the process of forming the MOSFET.

To achieve these and other advantages and in accordance with the purpose of the invention, as embodied and broadly described herein, the invention provides a method for forming a MOSFET. First, a pad oxide layer and a mask layer are formed on a substrate in sequence, and then the pad oxide layer and the mask layer are patterned to form an opening exposes the substrate. The opening is filled with an epitaxial silicon layer. A surface level of the epitaxial silicon layer is substantially the same as that of the mask layer. Then, the mask layer is removed to expose the pad oxide layer. An oxide layer is formed over the substrate. Next, a portion of the oxide layer is removed to expose the epitaxial silicon layer. Finally, a gate is formed on the epitaxial silicon layer by the conventional method, and source/drain regions are formed in the epitaxial silicon layer.

The feature of this invention is that an epitaxial silicon layer with device isolation structures is formed over the substrate, wherein each device isolation structure is made of oxide. The invention need not etch the substrate for forming a device isolation structure. As a result, the invention not only prevents stress and dislocation generation and avoids leakage current, but also provides an easily method for forming a device isolation structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
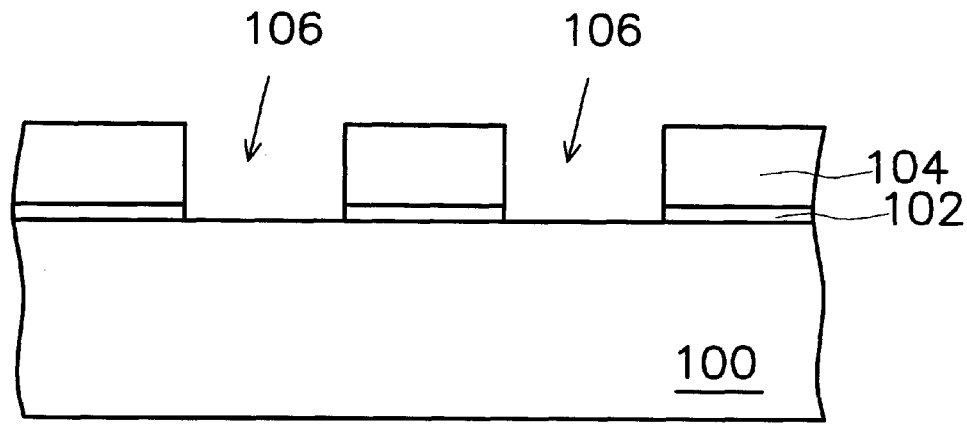
FIGS. 1A through 1E are schematic, cross-sectional views showing the processing steps for forming a MOSFET according to the preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross-sectional views showing the processing steps for forming a MOSFET according to the preferred embodiment of this invention.

Referring to FIG. 1A, a pad oxide layer 102 and a mask layer 104 are formed on a substrate 100 in sequence. A patterned photoresist layer (not shown) is formed on the mask layer 104 to pattern the pad oxide layer 102 and the mask layer 104, and then an opening 106 is formed in the pad oxide layer 102 and the mask layer 104 to expose the substrate 100. The pad oxide layer 102 is formed, for example, by thermal oxidation. The mask layer 104 is, for example, a silicon nitride layer formed by, for example, chemical vapor deposition (CVD). The sum of the thickness of the pad oxide layer 102 and the thickness of the mask layer 104 is about 3000–4000 Å.

Figure 1B:
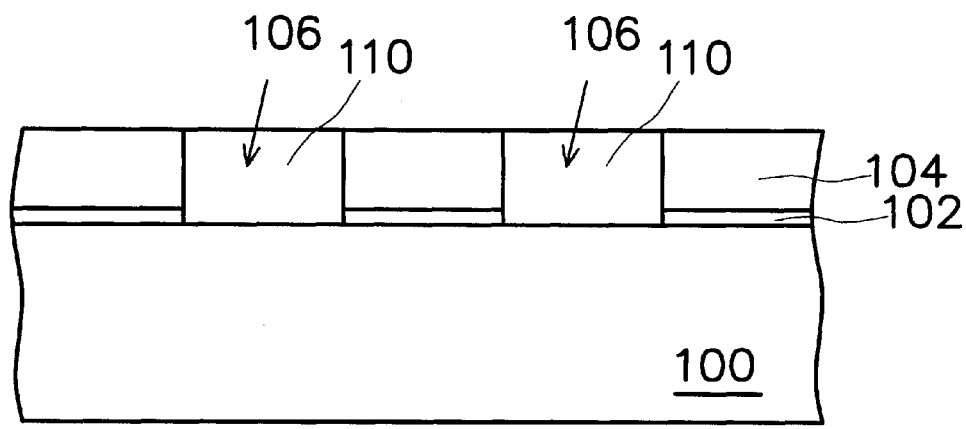

Referring to FIG. 1B, the opening 106 is filled with an epitaxial silicon layer 110. The method of forming the epitaxial silicon layer 110 is described as follows. First, an epitaxial silicon layer (not shown) is deposited on the mask layer 104 and fills the opening 106. Then, while the mask layer 104 serves as a stop layer, a portion of the epitaxial silicon layer is removed by etching back to form the epitaxial silicon layer 110. A surface level of the epitaxial silicon layer 110 is substantially the same as that of the mask layer 104. Namely, the thickness of the epitaxial silicon layer 110 is about 3000–4000 Å.

Figure 1C:
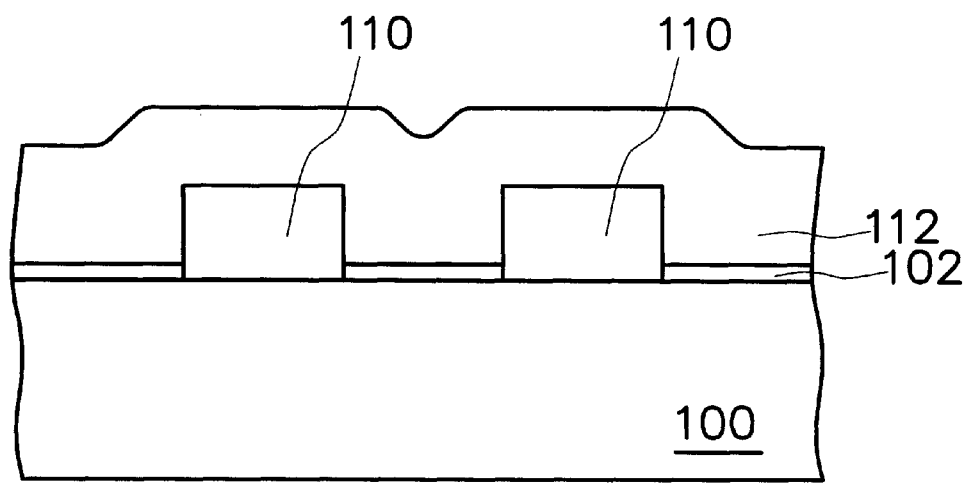

Referring to FIG. 1C, the mask layer 104 is removed to expose the pad oxide layer 102, and then an oxide layer 112 is formed over the substrate 100.

Figure 1D:
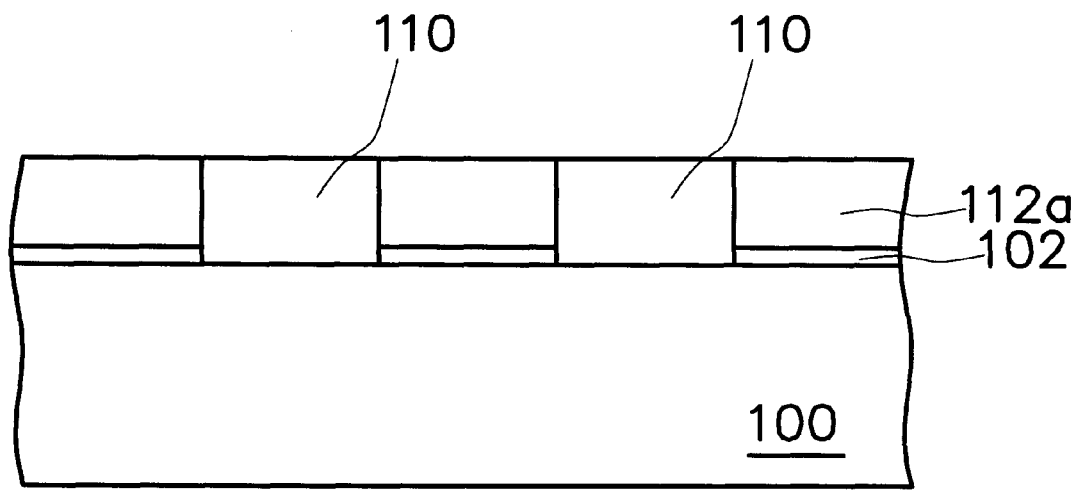

Referring to FIG. 1D, the oxide layer 112 over the epitaxial silicon layer 110 is removed by, for example, etching back or chemical mechanical polishing (CMP) to form an oxide layer 112a. A surface level of the oxide layer 112a is substantially the same as that of the epitaxial silicon layer 110. The combination of the oxide layer 112a next to the epitaxial silicon layer 110 and the pad oxide layer 102 serves as a device isolation structure in the invention instead of the conventional device isolation structure.

Figure 1E:
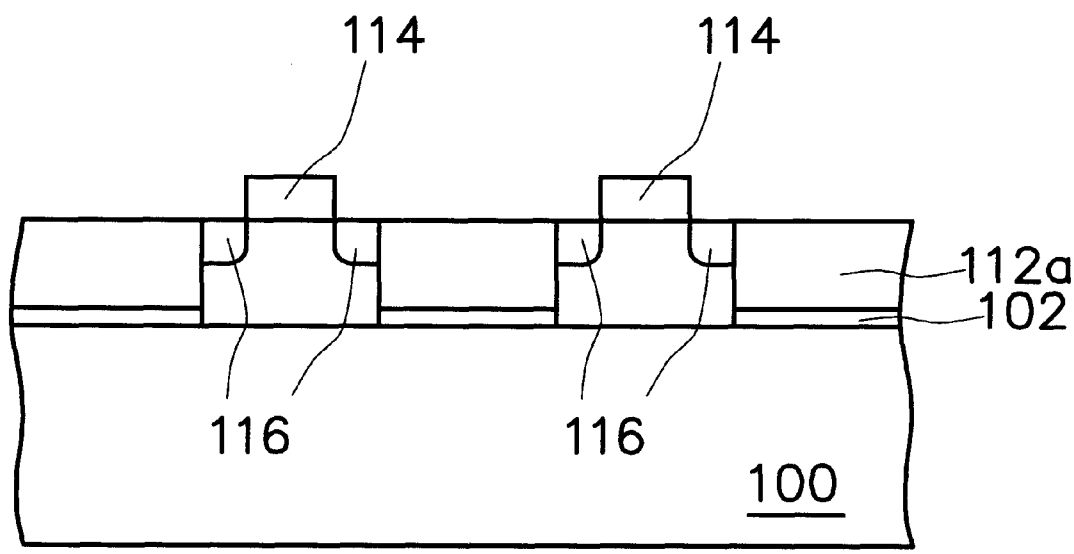

Referring to FIG. 1E, a gate 114 is formed on the epitaxial silicon layer 110 by conventional technology, and then source/drain regions 116 are formed in the epitaxial silicon layer 110.

The invention provides a method for forming a device isolation structure without etching the substrate, so that stress and dislocation generation while etching the substrate can be avoided. As a result, leakage current is avoided.

Accordingly, the feature of this invention is that an epitaxial silicon layer with device isolation structures is formed over the substrate, wherein each device isolation structure is made of oxide. The invention need not etch the substrate to form a device isolation structure. As a result, the invention not only prevents stress and dislocation and avoids leakage current, but also provides an easiy method for forming a device isolation structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a MOSFET, comprising the steps of:

providing a substrate;

forming a mask layer having an opening to expose the substrate;

filling the opening with an epitaxial silicon layer, wherein a surface level of the epitaxial silicon layer is substantially the same as that of the mask layer;

after filling the opening with the epetaxial silicon layer, removing the entire mask layer to expose the substrate;

forming an oxide layer on the exposed substrate, wherein a surface level of the oxide layer is substantially the same as that of the epitaxial silicon layer; and forming a gate on the epitaxial silicon layer and source/drain regions in the epitaxial silicon layer.

2. The method of claim 1, wherein the mask layer includes silicon nitride.

3. The method of claim 1, further comprising a step of forming a pad oxide layer before the step of forming the mask layer.

4. The method of claim 1, wherein the thickness of the epitaxial silicon layer is about 3000–4000 Å.

5. The method of claim 1, wherein the oxide layer serves as a device isolation structure.

6. A method for forming a MOSFET, comprising the steps of:

forming a pad oxide layer and a silicon nitride layer on a substrate in sequence;

forming an opening in the silicon nitride layer and the pad oxide layer to expose a portion of the substrate;

filling the opening with an epitaxial silicon layer, wherein a surface level of the epitaxial silicon layer is substantially the same as that of the silicon nitride layer;

after filling the opening with an epitaxial silicon layer, removing the entire silicon nitride layer to expose the pad oxide layer;

forming an oxide layer over the substrate;

planarizing the oxide layer to expose the epitaxial silicon layer; and forming a gate on the epitaxial silicon layer and source/drain regions in the epitaxial silicon layer.

7. The method of claim 6, wherein the step of planarizing the oxide layer includes etching back.

8. The method of claim 6, wherein the step of planarizing the oxide layer includes chemical mechanical polishing.

9. The method of claim 6, wherein the thickness of the epitaxial silicon layer is about 3000–4000 Å.

10. The method of claim 6, wherein a residual oxide layer and a residual pad oxide layer serve as a device isolation structure.

11. A method for forming a device isolation structure, comprising the steps of:

forming a mask layer with an opening on a substrate to expose a portion of the substrate;

filling the opening with an epitaxial silicon layer, wherein a surface level of the epitaxial silicon layer is substantially the same as that of the mask layer;

removing the mask layer to expose the substrate; and forming an oxide layer on the substrate, wherein a surface level of the oxide layer is substantially the same as that of the epitaxial silicon layer.

12. The method of claim 11, wherein the mask layer includes silicon nitride.

13. The method of claim 11, further comprising a step of forming a pad oxide layer before the step of forming the mask layer.

14. The method of claim 11, wherein the thickness of the epitaxial silicon layer is about 3000–4000 Å.

* * * * *